(54) DETECTING A REMAINING BATTERY CAPACITY AND A BATTERY REMAINING CAPACITY CIRCUIT

(75) Inventor: Hiroshi Mukainakano, Stevenson Ranch, CA (US)

(73) Assignee: Quallion LLC, Sylmar, CA (US)

( * ) Notice: Subject to any disclaimer, the term of this patent is extended or adjusted under 35 U.S.C. 154(b) by 44 days.

(21) Appl. No.: 09/778,275

(22) Filed: Feb. 6, 2001

(51) Int. Cl.⁷ .......................... H02J 7/00; G01N 27/416
(52) U.S. Cl. ........................................ 320/132; 324/427
(58) Field of Search .................................. 320/132, 134, 320/136, 162; 324/427, 433

(56) References Cited

U.S. PATENT DOCUMENTS 4,071,822 A * 1/1978 Kamiya ........................ 324/111
6,127,811 A * 10/2000 Shenoy et al. ............... 320/166

FOREIGN PATENT DOCUMENTS

JP         9-312172        12/1997

* cited by examiner

Primary Examiner—Gregory J. Toatley, Jr.
(74) Attorney, Agent, or Firm—Mary Elizabeth Bush; Freilich Hornbaker & Rosen

(57) ABSTRACT

A battery circuit, including a secondary battery, a storage capacitor, two switches and two voltage monitor circuits, detects a remaining capacity of the secondary battery and sends out data indicative of the remaining capacity to outside of the battery circuit. A first switch connects a secondary battery to a storage capacitor. A second switch connects the other end of the first switch to the storage capacitor and a load. A storage capacitor voltage monitor circuit measures voltage of the storage capacitor. The first switch is then turned ON and a current from the battery is transferred to the storage capacitor. At this time, the second switch is OFF. Then, the first switch is then turned OFF, and voltage of the storage capacitor indicative of the voltage of the secondary battery is measured. Then, the second switch turns ON and the current flows from the storage capacitor to the external load. The voltage across the capacitor is measured again and the remaining capacity of the battery can be accurately determined.

26 Claims, 7 Drawing Sheets

FIG.4

| Period | First SW | Second SW | Charge-and-discharge condition of secondary battery 1 | Charge-and-discharge condition of storage capacitor 5 |
|---|---|---|---|---|
| (1) | ON | OFF | Discharging to the capacitor | Charged by battery |
| (2) | OFF | OFF | OPEN | OPEN |
| (3) | OFF | ON | OPEN | Wait Charging |
| (4) | OFF | ON | OPEN | Discharging to load |
| (5) | OFF | ON | OPEN | Waiting discharge |
| A | OFF | OFF | Measure voltage of battery | |
| B | OFF | OFF | Measure storage voltage of capacitor before discharge | |
| C | OFF | ON | Measure voltage of storage capacitor after discharge | |

FIG. 5

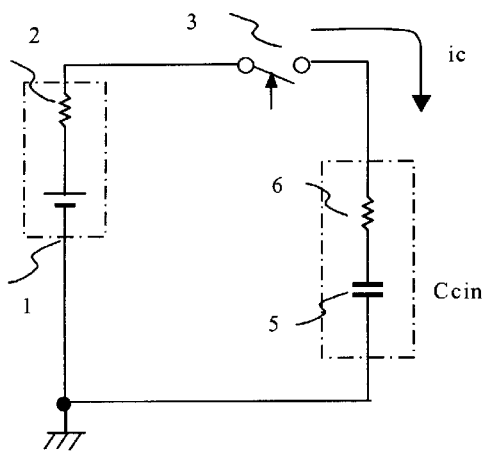

DETECTING A REMAINING BATTERY CAPACITY AND A BATTERY REMAINING CAPACITY CIRCUIT

BACKGROUND OF THE INVENTION

1. Field of the Invention

This invention generally relates to batteries and particularly to a secondary battery circuit capable of determining a remaining capacity of a secondary battery and to a method of determining the remaining capacity of a secondary battery.

2. Discussion of the Related Art

FIG. 1 shows a battery circuit 25 including a conventional battery condition monitoring circuit 27 that indicates a remaining charge state like that illustrated in Japanese Patent Application Toku Kai Hei 9-312172 entitled "A Battery Pack, Charging Device, and Charging System and Charting Method." The FIG. 1 circuit uses a microcomputer to detect battery voltage and charge-and-discharge current information. Based on measured discharge characteristics, the monitoring circuit calculates the battery's remaining capacity or stored charge. The microcomputer can transfer information about the battery's remaining capacity to an external device, such as a portable computer. The external device then is able to display information, such as remaining usable time of the external device.

Battery condition monitoring circuit 27 includes a voltage monitor 19 and a current monitor 18. The battery circuit 25 measures information about the voltage and charge-and-discharge current of secondary batteries 1, 1A, 1B and 1C. The battery circuit 25 predicts the remaining capacity from this information and can then transfer that remaining capacity information to an external device. The voltage monitor 19 and the current monitor 18 transfer the battery condition information to the microcomputer 20.

Voltage detection device 17 detects the level of the secondary battery voltage in comparison to a predetermined battery voltage. A second switch circuit 4 stops the charging of the battery when the battery voltage reaches a predetermined level indicated by the predetermined voltage. Together, the voltage detection device 17 and the second switch circuit 4 prevent a lithium ion secondary battery from overcharging. Switch circuit 3 prevents the lithium ion secondary battery from discharging below a predetermined level indicated by a predetermined voltage. Microcomputer 20 also controls the charging-and-discharging.

SUMMARY OF THE PREFERRED EMBODIMENTS

Conventional voltage monitoring circuits do not reliably determine the charging state of secondary batteries. For example, many conventional circuits that measure the voltage of secondary batteries fail to account for the internal impedance of the secondary batteries. These conventional circuits may underestimate or overestimate the voltage of a secondary battery depending on when measurements are taken. Because at least some of these conventional circuits detect the secondary voltage by flowing current through a sense resistor, these circuits can waste battery charge and generate heat, possibly adversely affecting the other parts. In addition, conventional battery circuits may be undesirably large because they include many different circuits.

Aspects of the present invention provide a battery circuit capable of accurately detecting a battery remaining capacity, the battery circuit having a secondary battery, a storage capacitor, at least two switches, and two monitor circuits. The first switch connects the secondary battery to the storage capacitor and the second switch, and the second switch connects the storage capacitor to an external load. A secondary battery voltage monitor circuit is coupled to positive and negative terminals of the secondary battery, and a storage capacity voltage monitor circuit is coupled to positive and negative terminals of the storage capacitor. Before the first switch is turned ON and a charge from the secondary battery flows the storage capacitor, the secondary battery voltage monitor circuit measures a terminal voltage of the secondary battery and the storage capacitor voltage monitor circuit measures a terminal voltage of the storage capacitor. After the first switch element is turned ON and then OFF again, the storage capacity voltage monitor measures the terminal voltage of the storage capacitor.

Another aspect of the present invention provides a battery circuit having a capacitor and a monitoring circuit adapted to couple terminals of the capacitor to a battery. The monitoring circuit includes a first switch to selectively couple the capacitor to the battery and a second switch to selectively couple the capacitor to an external load. The battery circuit is charged and discharged in accordance with a voltage measured across the capacitor.

Yet another aspect of the present invention provides a battery circuit having a secondary battery, a capacitor selectively coupled to a load, a monitor circuit coupled to positive and negative terminals of the secondary battery, and at least one switch connecting the secondary battery and the capacitor. When the monitor circuit measures a voltage of the secondary battery, the capacitor supplies current to the load, and the secondary battery is in an open state and does not supply current to the load.

Yet another aspect of the present invention provides a method of measuring a remaining capacity of a secondary battery in a battery circuit and supplying a current to an external load outside the battery circuit. According to this method, first, the secondary battery is selectively connected to a capacitor via a first switch. When the first switch is ON, the secondary battery charges the capacitor. The capacitor is selectively connected to the external load via a second switch. When the second switch is ON, a current flows from the capacitor through the load. The first switch is turned ON and OFF to connect and disconnect the battery and the capacitor. A terminal voltage of the capacitor is measured with a monitor circuit coupled across terminals of the capacitor. The current flows from the battery device to the external load.

Still another aspect of the present invention provides a method of measuring a remaining capacity of a secondary battery in a battery circuit and supplying a current to an external load outside the battery circuit. The method measures a remaining capacity of a secondary battery by charging and discharging the secondary battery in accordance with a voltage measured across a capacitor selectively coupled to terminals of the secondary battery via a switch.

BRIEF DESCRIPTION OF THE DRAWINGS

FIG. 4 is a table that explains modes and operations of the battery circuit illustrated in FIG. 2.

FIG. 5 illustrates an equivalent circuit that transfers a current from the secondary battery to the storage capacitor in the battery circuit capable of detecting a remaining capacity in accordance with aspects of the present invention.

DETAILED DESCRIPTION OF THE PREFERRED EMBODIMENTS

Figure 1:
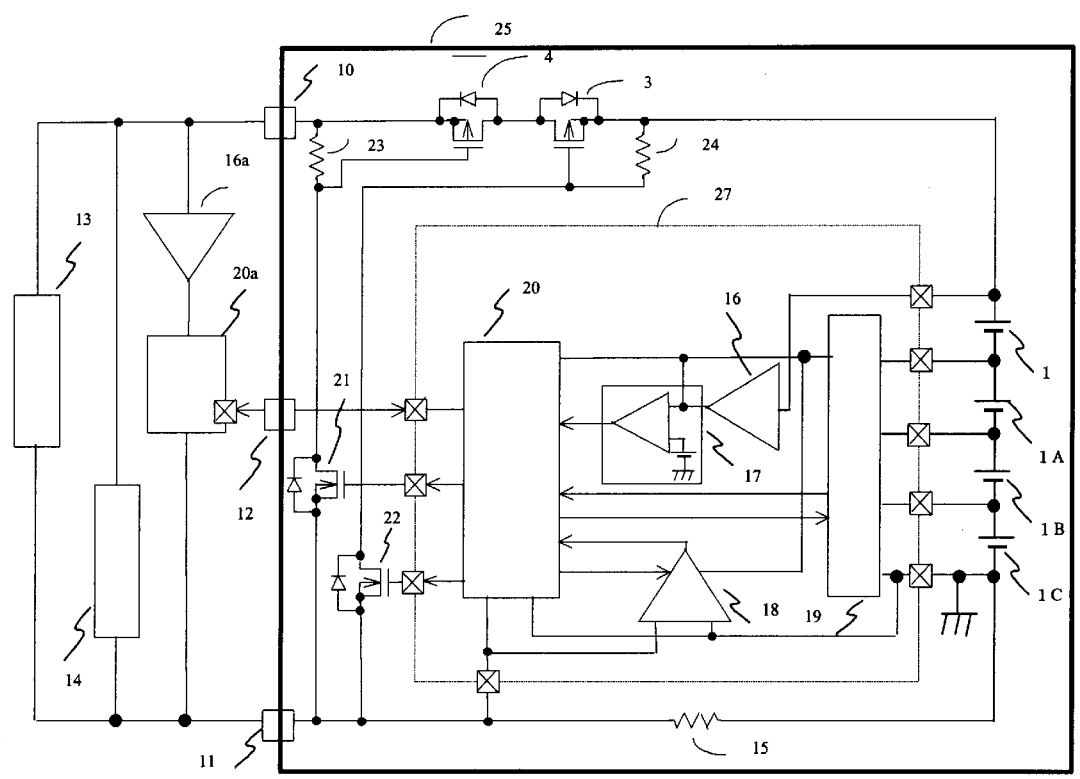
FIG. 1 illustrates a conventional battery circuit capable of detecting a remaining capacity.

Secondary batteries have internal impedance but conventional voltage monitoring circuits typically do not account for this internal impedance in determining the charging state of the battery. In typical monitoring circuits, the charging state of the battery is determined by connecting the battery across a load, causing a current to flow through the load, and measuring the voltage drop across the load. The battery's internal impedance acts as a series resistance in this measurement circuit so that failing to account for this internal impedance underestimates the voltage of the battery when measurements are taken during the discharge through the load. On the other hand, when measurements are taken during battery charging, failing to account for the internal impedance of the battery can cause the charging system to overestimate the battery voltage. Because typical battery monitoring circuits fail to account for a battery's internal impedance, the battery voltage is often not accurately monitored.

Conventional battery circuits are undesirably large because they include many different circuits, including a microcomputer, a sense resistor as the load for measuring the battery remaining capacity, and a voltage amplifier. Detecting the battery remaining capacity according to this method can cause an undesirably large current flow through the sense resistor, wasting battery charge. Furthermore, the current flow generates heat, which adversely affect other parts.

Preferred implementations of the present invention can accurately measure battery remaining capacity. Moreover, these implementations can be inexpensive.

In particularly preferred implementations of the present invention, battery remaining capacity is not measured by flowing current from the battery through a load. Rather, particularly preferred implementations measure the remaining capacity of the battery by first charging a storage capacitor. Preferred implementations disconnect the battery from the storage capacitor and then measure the remaining capacity of the battery indirectly by monitoring the discharge of the storage capacitor charged by the battery.

According to one aspect of the invention, a preferred battery circuit capable of detecting a remaining battery capacity provides a storage capacitor that stores the charge of the battery. Charge transfer from the secondary battery to the storage capacitor preferably is controlled by two or more switches. A control circuit controls these switches. Current flows from the battery to the storage capacitor via the first switch, and from the storage capacitor to a load such as an external load via the second switch. A voltage monitor circuit measures changes in the voltage across the storage capacitor. At a predetermined timing, the control circuit directs the voltage monitor circuits to measure a terminal voltage of the storage capacitor. The first switch is opened when the voltage monitoring circuit measures the voltage. Particularly preferred embodiments are described below in more detail with reference to figures.

Figure 2:
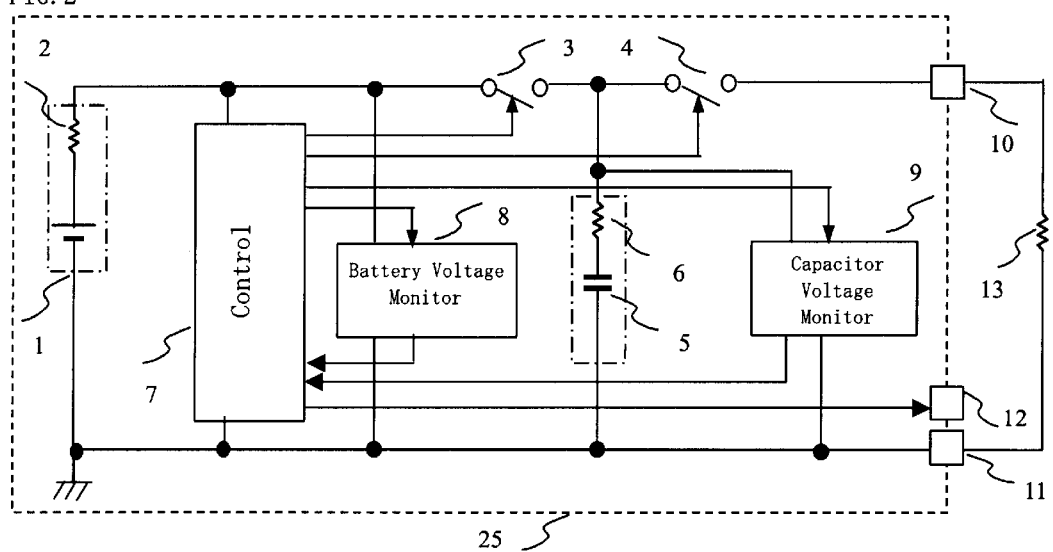
FIG. 2 illustrates a battery circuit capable of detecting a remaining capacity in accordance with aspects of the present invention.

FIG. 2 illustrates a preferred embodiment of a battery circuit for detecting a remaining capacity of a secondary battery. The battery circuit is connected to at least one secondary battery 1, which is a lithium ion battery cell in this illustration. Although only one secondary battery 1 is illustrated, the circuit measures battery voltage and remaining capacity in the same manner if a number of the secondary batteries 1 are connected in series or in parallel. Impedance 2 represents the inherent internal impedance of the secondary battery 1.

The positive terminal of secondary battery 1 is connected to a terminal of a first switch 3. The first switch 3 preferably has a small resistance in its ON or conducting state, and in general, a field effect transistor (FET) is used for this switch. The other terminal of the first switch 3 is connected to a storage capacitor 5 and a second switch 4. Internal impedance 6 represents the inherent internal impedance of the storage capacitor 5. It is also desirable that the second switch 4 has a small resistance in its conducting state, and in general, a FET is used. The other terminal of the second switch 4 is connected to a positive terminal 10 of the battery circuit. Current flows through the positive terminal outside the battery circuit 25.

The first switch 3 controls the transfer of charge between the secondary battery 1 and the storage capacitor 5. The second switch 4 controls the transfer of charge between the storage capacitor 5 and a load 13 or a charger. In the illustrated configuration the first switch 3 and the second switch 4 are connected to the positive side of the secondary battery 1, but the operation of the battery circuit is similar if the switches are connected to the negative side of the secondary battery 1.

In the embodiment shown in FIG. 2, a battery voltage monitor circuit 8 monitors the voltage of the secondary battery 1 in a conventional manner to ensure the battery voltage is within desired limits. The remaining capacity is detected using the storage capacitor voltage monitor circuit 9 that monitors the voltage of the storage capacitor 5. Monitoring the terminal voltages of the capacitor does not have to be performed continuously. Rather, monitoring is preferably performed at a set of at least two predetermined times, as is explained below. In this preferred implementation, the monitoring circuits do not significantly increase current consumption.

A voltage amplifier may be provided within the battery circuit when an output voltage value of the battery voltage monitor circuit 8 or the storage capacity voltage monitor circuit 9 is too small to reliably be read by the control circuit 7. An explanation of a circuit for such a voltage amplifier is omitted here since it is generally known in the art.

The voltage data measured by the battery voltage monitor circuit 8 and the storage capacitor voltage monitor circuit 9 is sent to the control circuit 7. The control circuit 7 converts the voltage of the secondary battery 1 and the storage capacitor 5 to digital data using conventional analog-to-digital converter (ADC). A description of an ADC circuit is omitted here since it is generally known in the art. High resolution analog to digital conversion of the capacitor voltage is desired for accurately detecting the battery remaining capacity. The control circuit 7 controls the ON/OFF state of the first switch 3 and the second in switch 4. The control circuit 7 also determines the timing of the charge transfer from the secondary battery 1 to the storage capacitor 5 and the timing of the charge transfer from the storage capacitor 5 to the load 13.

The control circuit 7 is capable of communicating with an element outside the battery circuit 25. The control circuit 7 can send out from a data transfer terminal 12 the voltage data of the secondary battery 1, the voltage data of the storage capacitor 5, and the battery remaining capacity data, which is calculated based on the voltage data of the secondary battery 1 and the storage capacitor 5. When the battery circuit in accordance with the present invention is used in a portable device, such as a notebook or other portable computer, it is possible to display how much time remains before the charge runs out based on the data gained from the data transfer terminal 12. Portable devices are easier to operate when these more precise data are available.

The first switch 3 and the second switch 4 can prevent overcharging and overdischarging of the battery circuit 25. According to certain preferred embodiments of the present invention, a lithium ion battery can be used as a secondary battery even without the more typically required battery protection circuit to prevent an overcharge or overdischarge of the lithium ion battery. Accordingly, the battery circuit can be made smaller.

Figure 3:
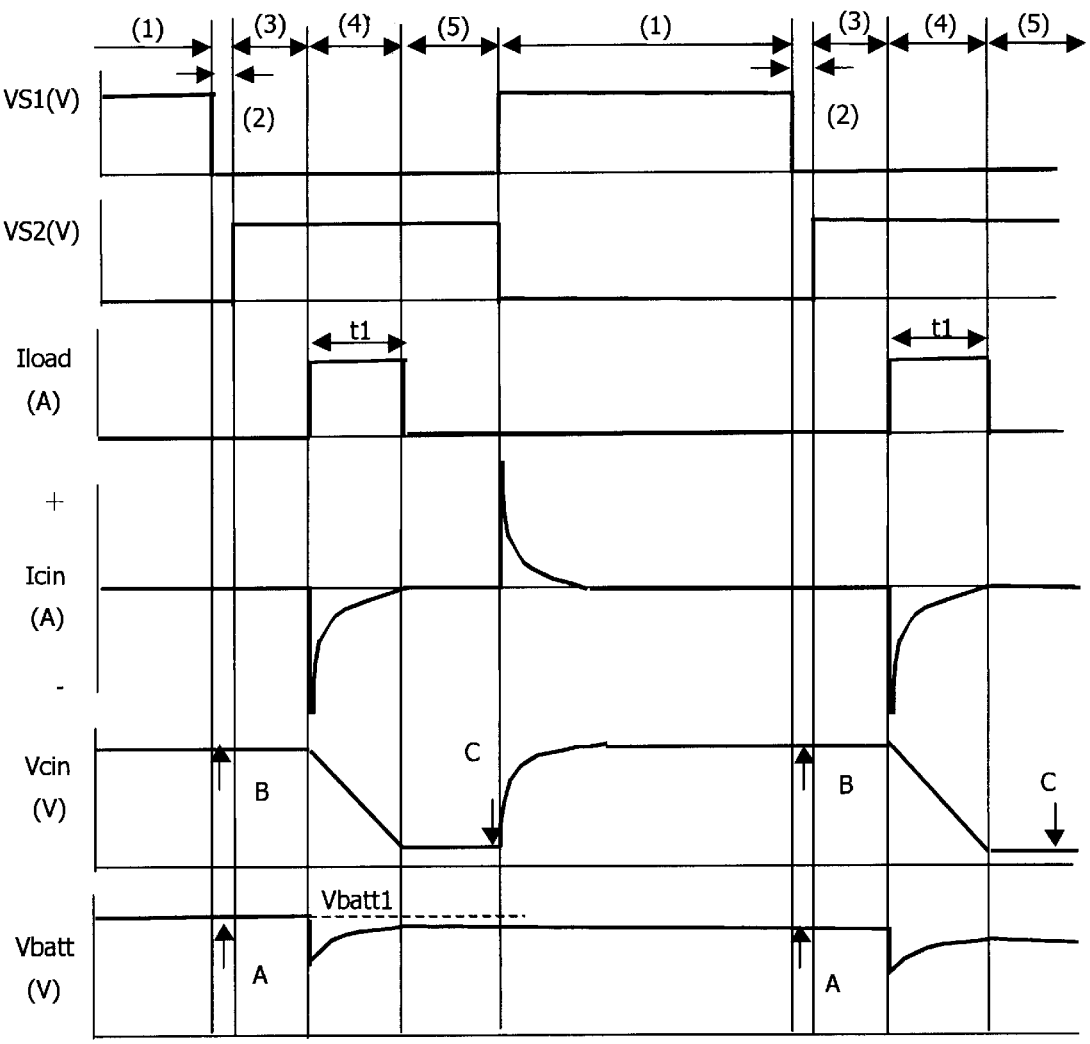
FIG. 3 shows a timing chart that explains operations of the battery circuit illustrated in FIG. 2.

Operation modes of the illustrated battery circuit are explained hereinafter with reference to FIG. 3. In FIG. 3 the x-axis represents time and the y-axis represents electric voltage or current. Control voltages of the first switch 3 and the second switch 4 are represented by VS1 and VS2, respectively. When the control voltages VS1 and VS2 are high, the switches are conducting (ON), whereas when the control voltages are low, the switches are nonconducting (OFF). Iload represents an amount of current consumed by the load 13. As shown in FIG. 3, the capacitor charge passes through the load as a pulse-shaped signal, i.e., consuming a predetermined constant amount of current in a predetermined period. A similar conservation strategy is used in cellular phones in that cellular phones transmit signals in pulses since cellular phones otherwise consume a large amount of current while sending or receiving messages. Icin and Vcin represent the current that flows into, and the terminal voltage of, the storage capacitor 5, respectively. When the first switch 3 is ON, the current flows from the second battery 1 to the storage capacitor 5. This direction of flow is set to be a positive Icin direction. On the other hand, when the second switch 4 is ON, the current flows from the storage capacitor 5 through the load 13. This direction of flow is set to be a negative Icin direction. When second switch 4 is ON, the voltage of the storage capacitor 5, Vcin, decreases because the current is flowing out from the storage capacitor. Vbatt represents a terminal voltage of the second battery 1. Vbatt decreases as the current flows from the battery 1 to the storage capacitor 5.

FIG. 4 is a table that further illustrates operation of the illustrated embodiment. The table contains information relating to the ON/OFF states of the first switch 3 and the second switch 4, and the charge-and-discharge condition of the secondary battery 1 and the storage capacitor 5 in different periods. FIG. 3 indicates the different periods of the FIG. 4 table by an arrow and a numeral. As will be explained below, FIG. 4 also illustrates a timing at which the voltages of the secondary battery and the storage capacitor are measured.

The operation and the remaining capacity detector according to the present invention are explained in reference to FIGS. 1, 3 and 4. First, the period (1) shown in FIG. 3 is explained. During this period, the first switch 3 is ON, and the second switch 4 is OFF; thus, the secondary battery 1 and the storage capacitor 5 are connected. Because the current flows from the secondary battery 1 to the storage capacitor 5, the terminal voltage of the storage capacitor 5 increases as time passes. The terminal current Icin of the storage capacitor 5 can be expressed as follows:

$$Icin = \frac{dQ}{dt} = \frac{Vbattopen}{Rbatt + Rcin} \times \exp\left(-\frac{1}{(Rbatt + Rcin) \times Ccin} \times t\right) \quad \text{Equation (1)}$$

Where:
- Rbatt: Internal impedance of the secondary battery;
- Rcin: Equivalent internal impedance of the storage capacitor;
- Vbattopen: Open circuit voltage of the secondary battery;
- Ccin: Capacitance of the storage capacitor; and
- t: length of time of the period (1)

Accordingly, if time t of the period (1) is sufficiently long, the current that flows into the storage capacitor 5 becomes small. The terminal voltage of the storage capacitor 5 approaches the terminal voltage of the secondary battery 1 in this period.

Thereafter, during period (2), both the first switch 3 and the second switch 4 are turned OFF. In other words, the secondary battery 1, storage capacitor 5, and load 13 are in an open condition. At the timing A shown in FIG. 3, the battery voltage monitor circuit 8 measures the battery voltage. In this state, the secondary battery 1 is not supplying a current to the storage capacitor 5 or the load 13. Therefore, although internal impedance Rbatt exists, an open circuit voltage Vbattopen can be measured accurately. This is shown in an equation below:

$$Vbatt = Vbattopen - Idis \times Rbatt \quad \text{Equation(2)}$$

where:
- Idis: Current discharged from the secondary battery; and
- Vbatt: The output voltage of the secondary battery.

Suppose, for example, Idis equals $3\mu A$ and Rbatt equals $30m\Omega$. Then, an error with respect to the open circuit voltage becomes 90nV, which is not problematic. Accordingly, by measuring the secondary battery voltage at the timing A shown in FIG. 3, the accuracy of the measurement desirably improves. In comparison, suppose that Idis equals 3A, which is common for applications such as a notebook computer. Then, the error with respect to the open circuit voltage is 90mV. When charged higher than a predetermined overcharging limit voltage by 90mV, a lithium ion secondary battery is damaged and its battery capacity drops unacceptably. The method described addresses this problem because the battery voltage is measured accurately.

During period (2) indicated in FIG. 3, the storage capacitor voltage monitor circuit 9 measures the voltage of the storage capacitor 5. During this period, the storage capacitor is open, i.e., the storage capacitor is not connected to any element. Thus, even if an inherent internal impedance exists within the storage capacitor 5, it is possible to accurately measure the terminal voltage. The operational principles are the same as an open circuit voltage measurement of a battery voltage, so the explanation is omitted here. FIG. 3 also shows the timing B at which the terminal voltage of the storage capacitor 5 is measured. The timing B may be the same as the timing A, the timing at which the terminal voltage of the secondary battery 1 is measured. Since it is desirable that the internal impedance of the storage capacitor 5 is low, an electric double layer capacitor can be used for the storage capacitor 5. The terminal voltage of the storage capacitor 5 measured at this timing is called Vcin2.

During period (3), the load 13 awaits a pulse discharging. There is no problem with discharging if the switch 4 turns ON before the discharge of the load 13 starts. During this period, the secondary battery is in an open condition and no current is consumed.

During the period (4), the storage capacitor 5 discharges through the load 13. If the load 13 consumes current Iload during the period of T1, a charge of (load×T1) is consumed from the storage capacitor 5. As a result, the terminal voltage which was Vcin2 before the discharge changes to Vcin1 as shown in the equation below.

$$Vcin2 = Vcin1 - \frac{Iload \times T1}{Ccin} \quad \text{Equation (3)}$$

where:
Ccin: Capacitance of the storage capacitor;
Iload: Current through the load; and
T1: Length of time during which the storage capacitor discharges to the load.

In a more realistic model, internal impedance exists and a loss of current occurs as a result. But, with respect to the operational explanation of the present invention, there is no need to accurately measure the loss of current.

From the Equation (3), the capacitance value of the storage capacitor 5 is preferably selected to be:

$$Ccin > \frac{Iload \times T1}{Vbatt1} \quad \text{Equation (4)}$$

If the capacitance is selected to be lower than that given by the above Equation (4), the current supply to the load 13 is terminated and the battery circuit no longer functions as a battery.

During the period (5), the current supply to the load is terminated. Because there is no current supply to the load 13, the terminal voltage of the storage capacitor 5 is maintained at a constant voltage. At timing C, the terminal voltage of the storage capacitor 5 is once again measured. In order for the measurement to be accurate, it is desirable that the measurement is taken before the first switch 3 turns ON again. At this time, the terminal voltage of the storage capacity 5 is Vcin1.

Thereafter, the first switch 3 turns ON, the second switch element 4 turns OFF, and the operation is repeated again starting with period (1). Note that the discharge from the secondary battery 1 occurs only during the period (1) and only to the storage capacitor 5. In other words, the current discharged from the secondary battery 1 is supplied only to the storage capacitor 5. As a result, if the current supplied by the secondary battery 1 to the storage capacitor 5 can be measured, it is possible to measure the amount of current discharged by the secondary battery 1 without directly discharging the battery through a sense resistor.

Since the capacitance of capacitor 5 is well known, the voltage of the secondary battery can be accurately determined. This voltage can predict the remaining capacity of the battery according to the known methods and models.

Figure 6:
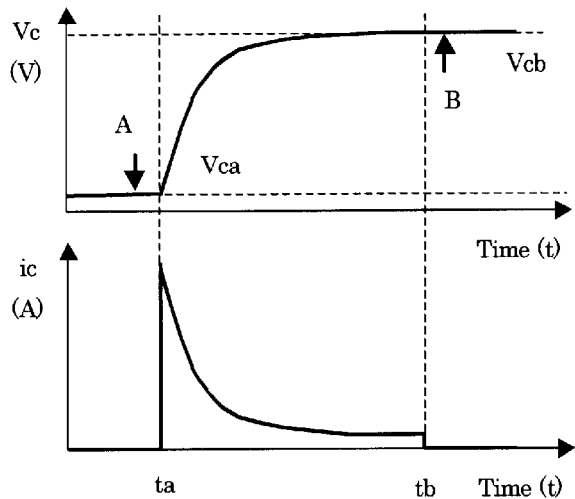
FIG. 6 illustrates a terminal voltage of the secondary battery and the storage capacitor when the current flows from the secondary battery to the storage capacitor in the battery circuit of FIG. 5.

Below is another explanation, in reference to FIGS. 5 and 6, of how a current discharged from the secondary battery 1 is measured. FIG. 5 shows an equivalent circuit in which the secondary battery 1 supplies a current to the storage capacitor 5. FIG. 6 shows the terminal voltage Vc of the storage capacitor 5 and the current ic that flows to each part connected in series with the storage capacitor 5. At a timing ta, the charging of the storage capacitor 5 starts, and at a timing tb, the charging stops. As explained above, because the voltages of the secondary battery 1 and the storage capacitor 5 are measured immediately before the timing ta, the voltages of the secondary battery 1 and the storage capacitor 5 are Vbatta, and Vca, respectively. Moreover, the voltage of the storage capacitor 5 immediately after the timing tb is Vcb.

Here, the current ic is a variable, varying as a function of time, so it is expressed as ic(t). A relationship between the terminal voltage Vc of the storage capacitor 5 and the stored charge at the timing tb is shown in an equation below.

$$Vcb = Vca + \frac{1}{Ccin} \times \int_{ta}^{tb} ic(t) \cdot dt \quad \text{Equation (5)}$$

The equation (5) above determines a total amount of current that flows through the storage capacitor during the ta-tb period. The following equation (6) is derived from the equation (5).

$$\int_{ta}^{tb} ic(t) \cdot dt = Ccin \times (Vcb - Vca) \quad \text{Equation (6)}$$

As is shown by FIG. 5, the current determined according to Equation (6) equals the amount of discharge from the battery per one measuring cycle (ta–tb). Because the voltages Vca and Vcb are measured by the storage capacitor voltage monitor circuit 9, if the capacitance value Ccin is predetermined to be a desired value, the total amount of current discharged from the secondary battery 1 can easily be calculated. What is noteworthy here is that, because resistance is not a factor in Equation (6), i.e., Equation (6) is independent of resistance, the resistance of the battery, storage capacitor and measurement circuit elements can be ignored. Accordingly, selecting parts to be used in the battery circuit becomes easier. Nevertheless, the switch is most preferably selected to have a low ON resistance since, if the ON resistance is high, the terminal voltage of the storage capacitor 5 is not increased to a desired extent.

In Equation (6), the left-hand side of the equation is i×t; thus the units are A×hr ("amp hours"). The capacity of the battery is generally represented in A×hr as well. Therefore, the remaining capacity of the secondary battery can be calculated easily by subtracting the amount of current flowing from the battery during one measuring cycle determined from Equation (6) from the remaining capacity at the end of each measuring cycle.

Figure 7:
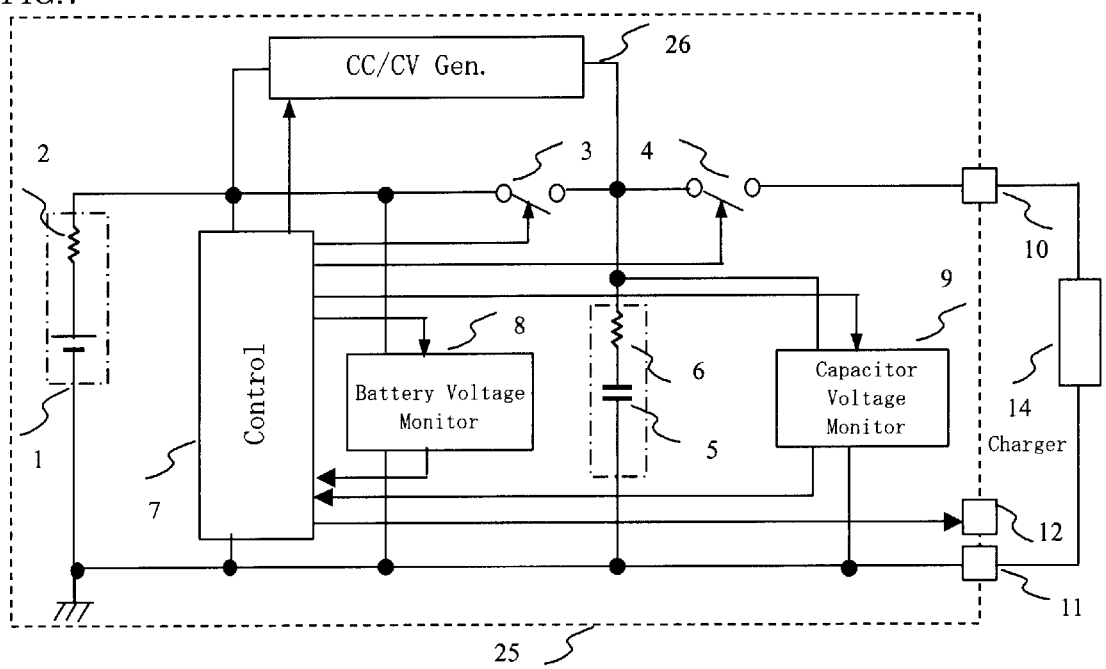
FIG. 7 illustrates a battery circuit capable of detecting a remaining capacity in accordance with other aspects of the present invention.

FIG. 7 shows another embodiment of a battery circuit in which a constant-current constant-voltage generation circuit 26 is added to the embodiment shown in FIG. 2. Since it is generally preferred to charge a lithium ion battery using a constant-current, constant-voltage method, the charging current is preferably adjusted with such a circuit. In FIG. 7, the constant-current, constant-voltage generation circuit 26 is placed in between the secondary battery 1 and the storage capacitor 5 to perform a charging function. After the charger 14 and the storage capacitor 5 are connected, the current is supplied from the storage capacitor 5 into the constant-current, constant-voltage generation circuit 26. This means that the direction of the current flow is reversed compared to the flow direction shown in FIG. 2. Accordingly, by adding the circuit shown in FIG. 7, it becomes possible to obtain accurate charging current information during battery-charging.

Another advantage of adding the constant-current, constant-voltage generation circuit 26 is that a battery can be charged safely with a constant-voltage charging device. Since there are many known methods of creating a constant-current, constant-voltage generation circuit, further explanation is omitted here.

Figure 8:
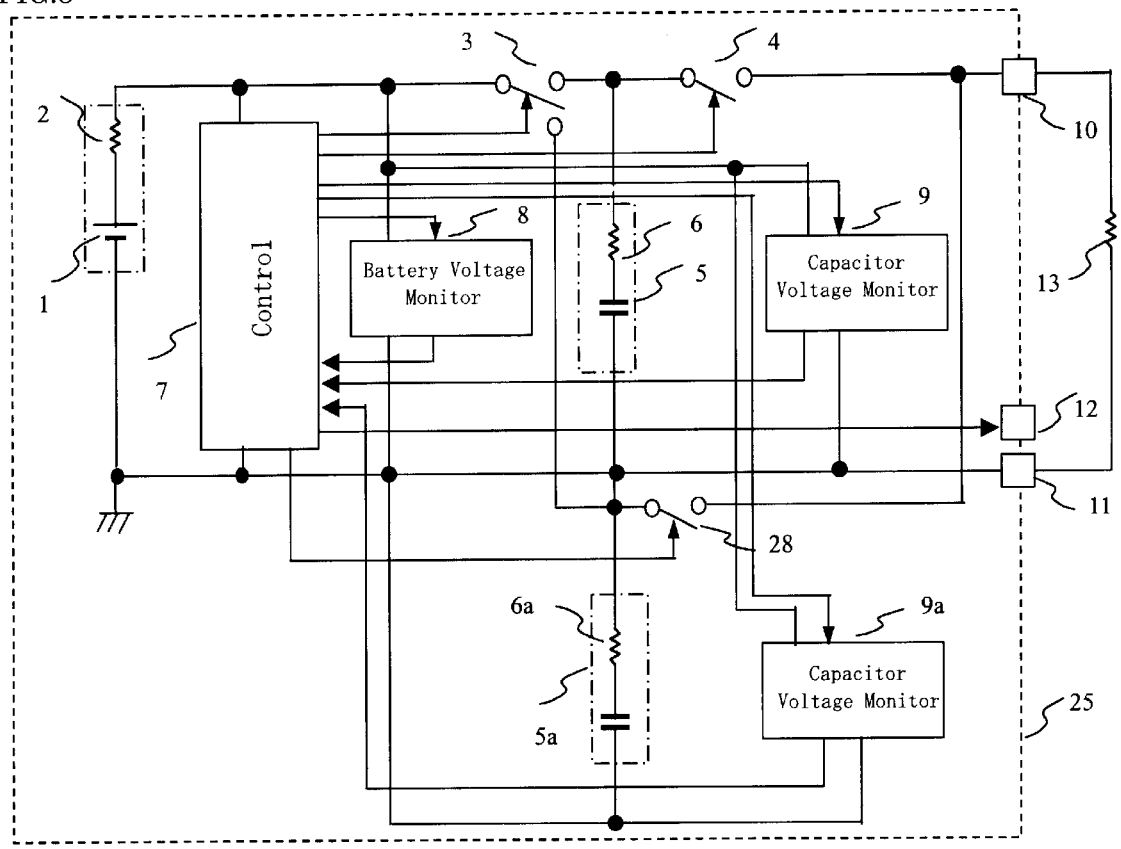
FIG. 8 illustrates a battery circuit capable of detecting a remaining capacity in accordance with other aspects of the present invention.

FIG. 8 illustrates yet another embodiment of the present invention. In FIG. 2, it was presumed that a pulsed signal passes through the load and that the load does not consume current at all times. If a circuit structure as shown in FIG. 8 is used, however, such A presumption is unnecessary. In other words, it can be presumed that a current flows from the battery circuit 25 to the load at all times. The circuit in FIG. 8 includes two storage capacitors 5 and 5a. If the circuit is constructed so that one of the storage capacitors is always connected to the load, the discharge can be maintained even if the load constantly consumes a current. A third switch 28 is added to control the structure.

In FIG. 8, voltage monitor circuits 9 and 9a are attached to storage capacitors 5 and 5a, respectively. If a terminal voltage of either of the storage capacitors 5 and 5a decreases below a predetermined value, the source of discharge can be switched to the other storage capacitor. By this operation, a stable current supply to the load is guaranteed. The control circuit 7 controls these switches.

Figure 9:
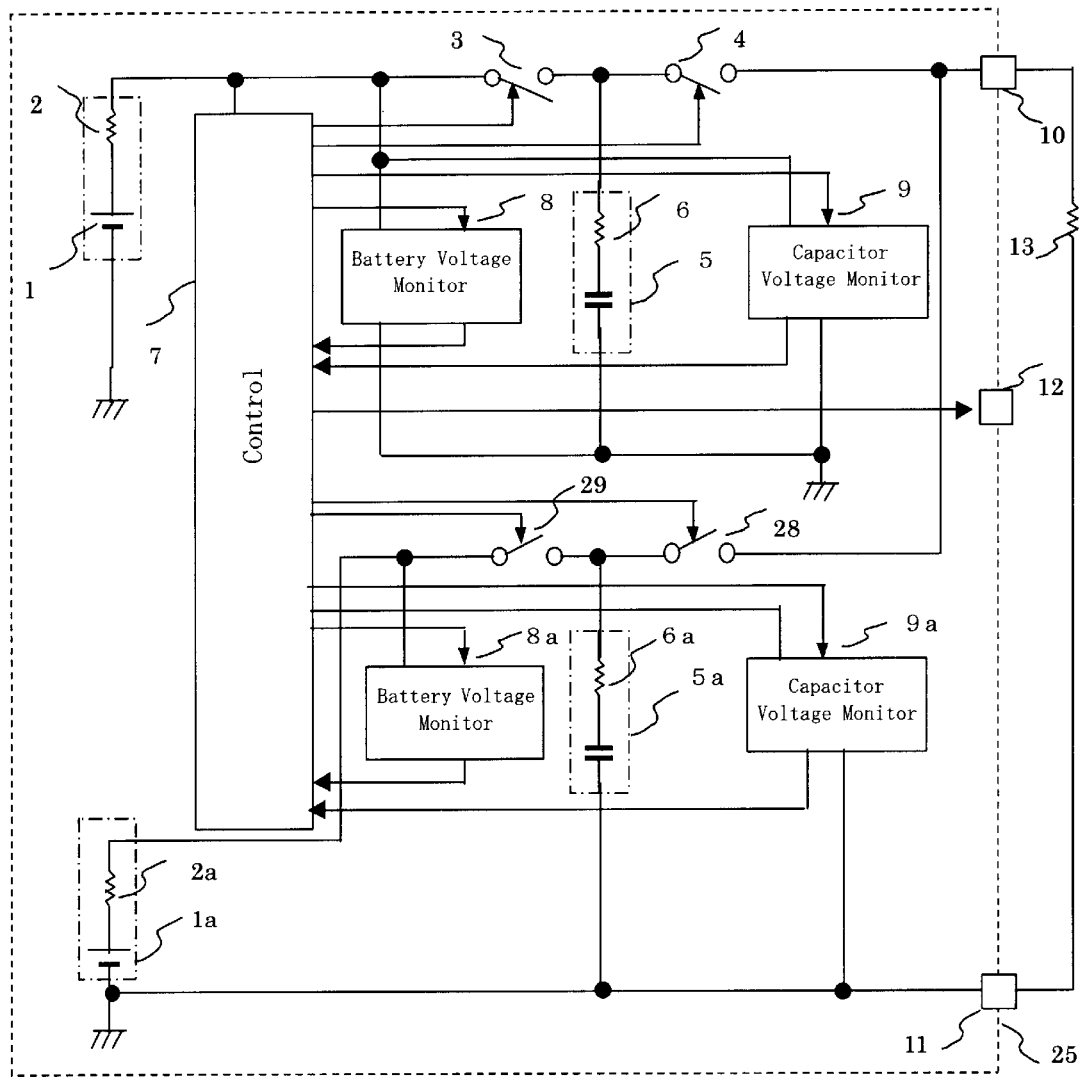
FIG. 9 illustrates a battery circuit capable of detecting a remaining capacity in accordance with other aspects of the present invention.

FIG. 9 illustrates yet another embodiment of the present invention. The circuit shown in FIG. 9 includes a plurality of circuits like those shown in FIG. 2. By switching the output, the circuit illustrated in FIG. 9 provides a constant discharge current to the load. Specifically, the circuit in FIG. 9 has the same elements as the circuit in FIG. 8, and additionally includes a secondary battery 1a and a fourth switch 29. This circuit operates similarly to the circuit in FIG. 8. The processing of the FIG. 9 circuit is more complex than that of the circuit in FIG. 8, however, because each battery's data is preferably separately managed and then combined before the data are sent outside the battery circuit. An advantage to using a plurality of batteries as in FIG. 9 is that the total battery capacity increases relative to a circuit that uses a single battery. Moreover, since the batteries are not connected in parallel, different types of batteries can be provided. Therefore, this structure gives considerable latitude in designing a battery circuit.

Figure 10:
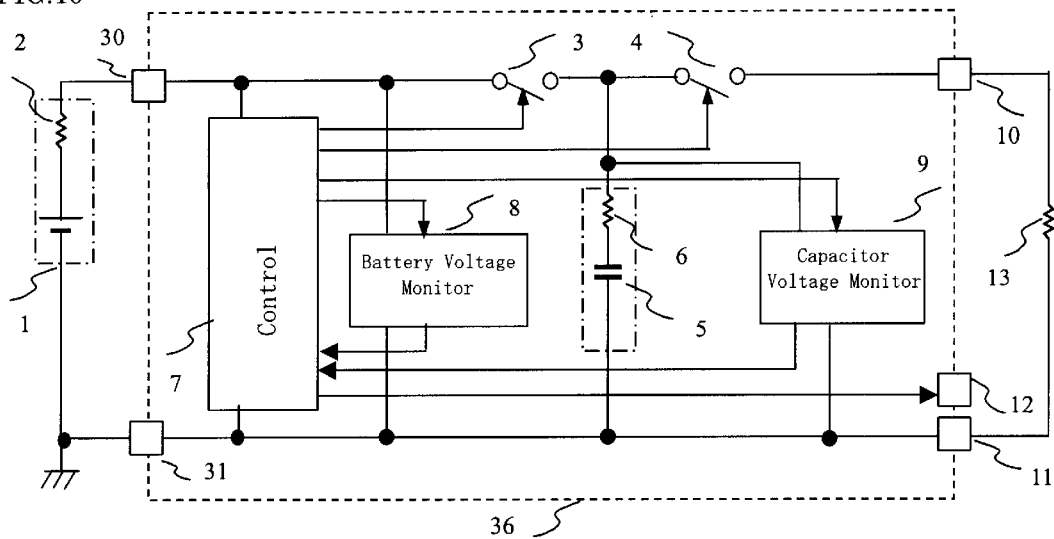
FIG. 10 illustrates a battery circuit capable of detecting a remaining capacity in accordance with other aspects of the present invention.

FIG. 10 illustrates yet another embodiment of the present invention. In this circuit, a battery is removed from the battery circuit. The circuit excluding the battery is called a battery remaining capacity detecting circuit 36. This circuit operates in the same way as the circuit in FIG. 2, but by removing the battery from the battery circuit, it becomes possible to place on a single substrate the entire battery remaining capacity detecting circuit 36. Thus, when the battery circuit is placed in a notebook or other portable computer, the battery can be removed while the battery remaining capacity detecting circuit remains intact inside the portable computer. This allows the battery pack for notebook or other portable computers to be made smaller.

Figure 11:
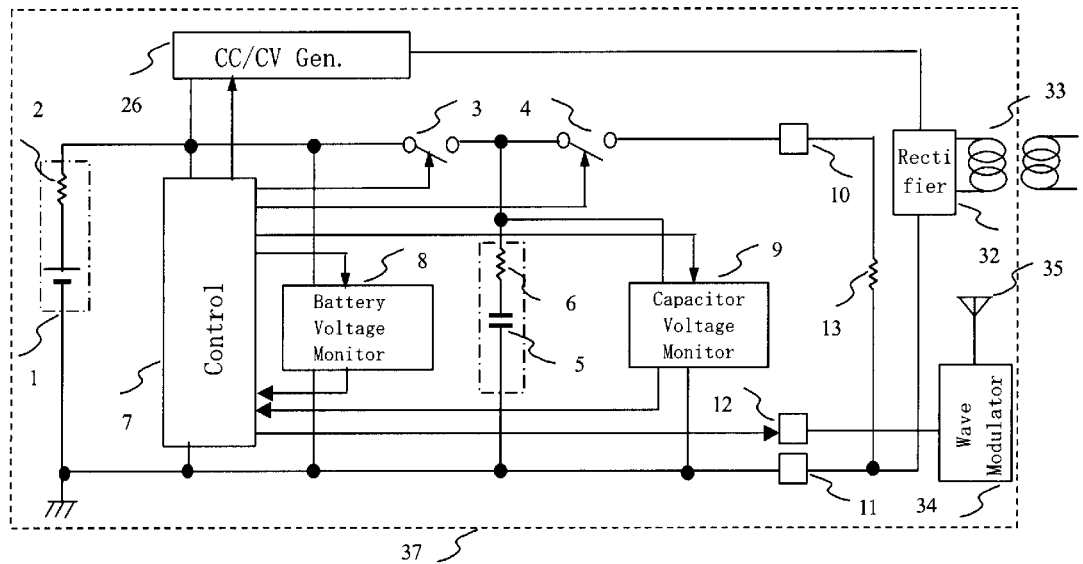
FIG. 11 illustrates a battery circuit capable of detecting a remaining capacity in accordance with other aspects of the present invention.

FIG. 11 illustrates yet another embodiment of the present invention. This embodiment includes a circuit similar to the one shown in FIG. 7, and additionally includes a rectifier 32, transformer 33, wave modulator 34, and antenna 35. By using the rectifier 32 and transformer 33, the secondary batteries can be charged wirelessly and remotely. The transformer eliminates a need to physically connect the battery circuit to the charging device. Moreover, the wave modulator 34 and antenna 35 allow battery data from the battery circuit to be transferred without a cable. Since the battery circuit shown in FIG. 11 is capable of performing charging, discharging, and data transfers without a cable, the battery circuit can be placed or implanted at a distant location. As a result, the battery circuit can be used in a variety of applications, such as medical implantable devices, temperature-measuring devices for water tanks, backup electrical sources and many others.

The present invention has been described in terms of certain preferred embodiments. Those of ordinary skill in the art will appreciate that the teachings of the present invention are not limited to these described embodiments. Those of ordinary skill will appreciate that various modifications and extensions of the described embodiments might be made without varying from the basic teachings of the present invention. For example, although most of the illustrations are made in terms of a single secondary battery, most of the teachings of the present invention are applicable to a system that includes multiple secondary batteries. In particular, if a plurality of secondary batteries is connected in series, the circuit operates in a manner similar to when a secondary battery voltage monitor circuit is connected to each of the plurality of the secondary batteries. Similarly, if plural secondary batteries are connected in parallel, a similar control circuit can be used in a similar manner. Consequently, the scope of the present invention is not to be limited to any of the described embodiments thereof but instead is to be determined from the claims, which follow.

What is claimed:

1. A battery circuit capable of supplying an electric current to an external load outside the battery circuit and detecting a battery remaining capacity, comprising
    a secondary battery,
    a storage capacitor,
    at least two switches, the first switch connecting the secondary battery to the storage capacitor and the second switch, and the second switch connecting the storage capacitor to the external load, and
    a storage capacity voltage monitor circuit coupled to terminals of the storage capacitor, wherein
        a remaining capacity of the secondary battery is measured by
        measuring a terminal voltage of the storage capacitor with the storage capacity voltage monitor circuit before the first switch is turned ON and a charge from the secondary battery flows to the storage capacitor, and
        measuring the terminal voltage of the storage capacitor with the storage capacity voltage monitor circuit after the first switch element is turned ON and then OFF.

2. The battery circuit of claim 1, wherein the secondary battery is charged via a transformer and a rectifier.

3. The battery circuit of claim 1, wherein various information from the battery circuit including the remaining capacity, battery voltage, and number of charging cycles are transferred outside the battery circuit via a wave modulator and antenna.

4. The battery circuit of claim 1, wherein the secondary battery is charged via a transformer and a rectifier, and various information from the battery circuit including the remaining capacity, battery voltage, and number of charging cycles are transferred outside the battery circuit via a wave modulator and antenna.

5. A battery circuit capable of detecting a remaining capacity, comprising
a capacitor and monitoring circuit adapted to couple terminals of the capacitor to a battery, the monitoring circuit including a first switch to selectively couple the capacitor to the battery and a second switch to selectively couple the capacitor to an external load, wherein the battery circuit is charged and discharged in accordance with a voltage measured across the capacitor.

6. The battery circuit of claim 5, further comprising terminals for receiving a replaceable secondary battery.

7. The battery circuit of claim 5, wherein the secondary battery is charged via a transformer and a rectifier.

8. The battery circuit of claim 5, wherein various information from the battery circuit including the remaining capacity, battery voltage, and number of charging cycles are transferred outside the battery circuit via a wave modulator and antenna.

9. The battery circuit of claim 5, wherein the secondary battery is charged via a transformer and a rectifier, and various information from the battery circuit including the remaining capacity, battery voltage, and number of charging cycles are transferred outside the battery circuit via a wave modulator and antenna.

10. A battery circuit, comprising
a secondary battery,
a capacitor selectively coupled to a load,
a monitor circuit coupled to terminals of the secondary battery,
at least one switch connecting the secondary battery and the capacitor, wherein
when the monitor circuit measures a voltage of the secondary battery, the capacitor supplies current to the load, and the secondary battery is in an open state and does not supply current to the load.

11. The battery circuit of claim 10, wherein the secondary battery is charged via a transformer and a rectifier.

12. The battery circuit of claim 10, wherein various information from the battery circuit including the remaining capacity, battery voltage, and number of charging cycles are transferred outside the battery circuit via a wave modulator and antenna.

13. The battery circuit of claim 10, wherein the secondary battery is charged via a transformer and a rectifier, and various information from the battery circuit including the remaining capacity, battery voltage, and number of charging cycles are transferred outside the battery circuit via a wave modulator and antenna.

14. A method of measuring a remaining capacity of a secondary battery in a battery circuit and supplying a current to an external load outside the battery circuit comprising:
selectively connecting the secondary battery to a capacitor via a first switch, the secondary battery charging the capacitor when connected to the capacitor when a potential difference exists between corresponding terminals of the secondary battery and the capacitor;
selectively connecting the capacitor to an external load via a second switch;
measuring a terminal voltage of the capacitor with a capacitor voltage monitor circuit coupled across terminals of the capacitor,
measuring a terminal voltage of the capacitor with the capacitor voltage monitor circuit after the first switch is first turned ON and then OFF to connect and then disconnect the secondary battery and the capacitor; and
supplying a current to the external load outside the battery circuit.

15. The method of claim 14, additionally comprising charging the secondary battery via a transformer and a rectifier.

16. The method of claim 14, additionally comprising transferring various information from the battery circuit including the remaining capacity, battery voltage, and number of charging cycles outside the battery circuit via a wave modulator and antenna.

17. The method of claim 14, additionally comprising charging the secondary battery via a transformer and a rectifier, and transferring various information from the battery circuit including the remaining capacity, battery voltage, and number of charging cycles are transferred outside the battery circuit via a wave modulator and antenna.

18. The method of claim 14, additionally comprising measuring a terminal voltage of the capacitor by the capacitor voltage monitor circuit after the second switch is turned ON and then OFF to connect and then disconnect the capacitor to the load.

19. The method of claim 18, additionally comprising charging the secondary battery via a transformer and a rectifier.

20. The method of claim 18, additionally comprising transferring various information from the battery circuit including the remaining capacity, battery voltage, and number of charging cycles outside the battery circuit via a wave modulator and antenna.

21. The method of claim 18, additionally comprising charging the secondary battery via a transformer and a rectifier, and transferring various information from the battery circuit including the remaining capacity, battery voltage, and number of charging cycles are transferred outside the battery circuit via a wave modulator and antenna.

22. A method of measuring a remaining capacity of a secondary battery by charging and discharging the secondary battery in accordance with a voltage measured across a capacitor selectively coupled to terminals of the secondary battery via a switch, the voltage measured after the current flows to the capacitor and the switch is turned OFF to uncouple the secondary battery from the capacitor.

23. The method of claim 22, additionally comprising placing and removing the secondary battery in and from a portable device while the battery circuit remains inside the portable device.

24. The method of claim 22, additionally comprising charging the secondary battery via a transformer and a rectifier.

25. The method of claim 22, additionally comprising transferring various information from the battery circuit including the remaining capacity, battery voltage, and number of charging cycles outside the battery circuit via a wave modulator and antenna.

26. The method of claim 22, additionally comprising charging the secondary battery via a transformer and a rectifier, and transferring various information from the battery circuit including the remaining capacity, battery voltage, and number of charging cycles are transferred outside the battery circuit via a wave modulator and antenna.

* * * * *